United States Patent [19]

Yonezawa

[11] Patent Number: 4,961,003
[45] Date of Patent: Oct. 2, 1990

[54] SCANNING ELECTRON BEAM APPARATUS
[75] Inventor: Akira Yonezawa, Koto, Japan
[73] Assignee: Seiko Instruments, Inc., Chiba, Japan
[21] Appl. No.: 430,355
[22] Filed: Nov. 1, 1989
[30] Foreign Application Priority Data
  Nov. 5, 1988 [JP] Japan ................. 63-279987
[51] Int. Cl.$^5$ ............................. H01J 37/09
[52] U.S. Cl. ................ 250/398; 250/396 ML; 250/310
[58] Field of Search ................ 250/398, 396 ML, 310

[56] References Cited
U.S. PATENT DOCUMENTS 3,870,891  3/1975  Mulvey ................. 250/398
4,882,486 11/1989  Kruit .................... 250/310

Primary Examiner—Jack I. Berman
Attorney, Agent, or Firm—Spensley Horn Jubas & Lubitz

[57] ABSTRACT

An apparatus for directing a scanned electron beam to a sample along an axis. An objective magnetic lens of a single-pole type focusses the scanned electron beam onto the sample. The objective magnetic lens includes a central pole portion extending along the axis and having a central end face effective to generate a magnetic field for focusing the scanned electron beam onto the sample and a peripheral sleeve portion extending along the axis and having a peripheral edge face effective to form a magnetic circuit between the central end face and the peripheral edge face, the peripheral sleeve portion having an inner radius R. A magnetic shield member is disposed to surround the sample to magnetically shield the same. The magnetic shield member has a central section spaced axially from the central end face of the pole portion a distance L which is not substantially less than R so that the magnetic shield member is not magnetically coupled to the magnetic circuit, and a peripheral section spaced from the peripheral edge face of the peripheral sleeve a spatial gap sufficient to magnetically isolate the magnetic shield member from the magnetic lens.

4 Claims, 6 Drawing Sheets

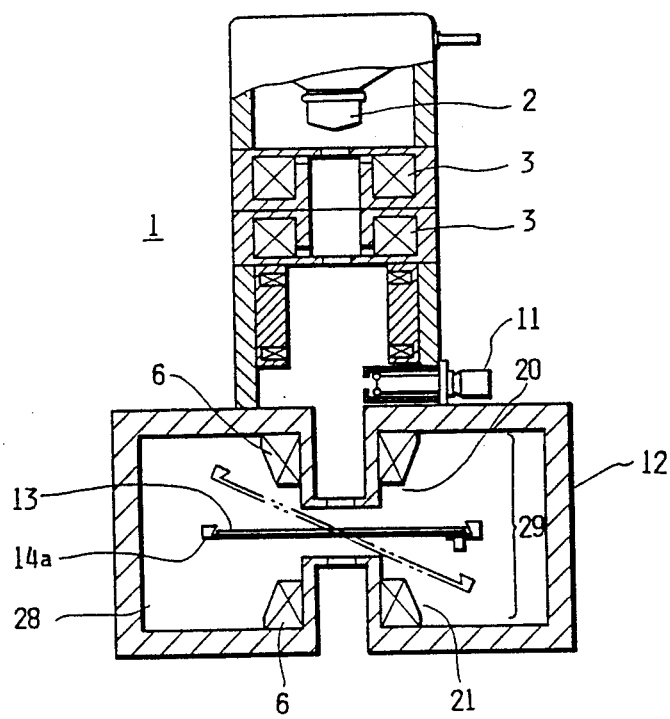
FIG. 8 PRIOR ART
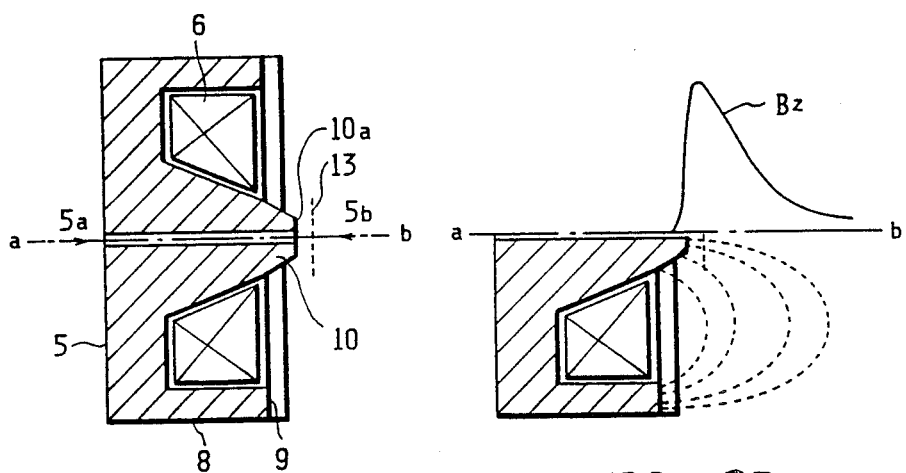
FIG. 9A PRIOR ART
FIG. 9B PRIOR ART

SCANNING ELECTRON BEAM APPARATUS

BACKGROUND OF THE INVENTION

The present invention relates to a scanning electron beam apparatus for observing a large size sample with high resolution while blocking external disturbing magnetic fields.

In recent years, low voltage acceleration of electrons has been proposed for observation of a semiconductor sample with a minimum of damage and no charging. However, the conventional scanning electron microscope (SEM) normally has insufficient resolution. In view of this, there has been developed a so-called in-lens SEM in which a sample is disposed within a magnetic field of an objective lens. However, this in-lens SEM can observe only a moderate size sample up to 10 mm in diameter. Accordingly, the in-lens SEM is not suitable for observation of a large size sample such as a 6-inch wafer which finds widespread use in the semiconductor industry. Therefore, another type of the SEM has been sought for observing a large size sample with high resolution.

For this purpose, a particular SEM is disclosed in Japanese Patent Application Laid Open No. 161235/1983. As shown in FIG. 8 of the present application (and referring to FIG. 5 of the above prior art application), the SEM disclosed in the cited Japanese application is composed of an objective lens 29 which has an upper magnetic pole 20 and a lower magnetic pole 21 separated from each other. These magnetic poles define therebetween a sample accommodation space 28 extending transversely of an alignment direction of the magnetic poles, and a sample holder 14a is interposed in a gap between the magnetic poles. The sample holder 14a has an area larger than that of the objective lens magnetic pole face. In the above-noted prior art application, the lower magnetic pole may be eliminated (as shown in FIG. 10 of the prior art application) such that sample accommodation space 28 can be enlarged to arrange therein various types of detectors and to increase the setting freedom of the sample holder.

Further, there has been proposed another type of SEM for the observation of a large size sample with high resolution, in which a single-pole magnetic lens 5 is utilized as an objective lens as shown in FIG. 9A. The single-pole magnetic lens 5 has an axially symmetric structure as shown in FIG. 9A, and is composed of a central tube 10 having an end face 10a in opposed relation to a sample 13, a peripheral sleeve 8 having an edge face 9, and an exciting coil 6. The central tube end face 10a and the peripheral sleeve edge face 9 constitute a magnetic circuit of the lens, and are disposed at the same side with respect to the sample 13. Other components such as an electron gun and a condenser lens may be disposed at either of sides a and b. The electron beam may irradiate the sample 13 in either of directions 5a and 5b. In either case, the single-pole magnetic lens can realize a smaller spherical aberration coefficient Cs and a smaller chromatic aberration coefficient Cc as compared to the ordinary SEM objective lens (Disclosed Document: S. M. Juma, et al., 1983, J. Phys. E Sci. Instrum., Vol. 16 P1063).

FIG. 9B shows the magnetic flux distribution and magnetic flux density distribution along an optical axis formed by the single-pole magnetic lens. The distribution of the magnetic flux density Bz has its maximum value in the vicinity of the central tube end face 10a. The distribution decreases abruptly in direction a and gradually in the other direction b. The sample 13 can be positioned at a point where the magnetic flux density Bz has nearly its maximum value to thereby realize a high resolution as in the case of the in-lens SEM. Moreover, since the central tube end face and peripheral sleeve edge face of the single-pole magnetic lens are disposed at the same side with respect to a sample, a sufficient space can be provided for accommodating a large size sample and sample stage to thereby enable observation of a large size sample.

However, in the apparatus shown in FIG. 8, the sample holder must have a planar shape. On the other hand, a sample stage of a standard SEM must be able to undergo various movements such as XY displacement, rotation and tilting, and it would be difficult to realize these needed movements in the planar sample stage.

As described before, the prior art application (No. 161235/1985) discloses another type of conventional SEM in which a lower magnetic pole piece is removed as shown in FIG. 10 of the prior art application. In this type, a variably movable sample stage can be provided in the SEM. However, in this structure, a sample chamber constitutes a part of a magnetic circuit of the objective lens. Therefore, asymmetry of the sample chamber may affect the electron optical system, thereby causing shortcomings such as axis distortion and astigmatism.

Further, in the other prior art shown in FIG. 9A herein, the central tube end face and the peripheral sleeve edge face constitute a magnetic single-pole structure to ensure good axial symmetry. On the other hand, since a sample is not surrounded by a magnetic container, external disturbing magnetic fields cannot be blocked and can thereby cause problems especially in low voltage acceleration operation.

In response to the above problems, a magnetic shield may be provided around a sample. In this case, if the magnetic shield constitutes a part of the magnetic circuit, the magnetic field of the single-pole magnetic lens is distorted to hinder its optimum performance and to cause drawbacks such as axis dislocation and astigmatism.

SUMMARY OF THE INVENTION

In view of this, an object of the present invention is to provide an improved scanning electron beam apparatus utilizing as an objective lens a single-pole magnetic lens effective to realize a large sample space and utilizing a magnetic shield disposed around a sample observation region and magnetically isolated from the single-pole magnetic lens.

In order to achieve the object, according to the present invention, the scanning electron beam apparatus is composed of an electron gun, a condenser lens, a scanning system, an objective lens and an electron detector. The apparatus is constructed such that the objective lens is composed of a single-pole magnetic lens, a magnetic shield member is provided around a sample so as to satisfy the relation: L≧R, where R denotes the inner radius of a peripheral sleeve of the single-pole magnetic lens and L denotes the distance between an end face of a central pole or tube of the single-pole magnetic lens and a central face of the magnetic shield member opposed to the central tube end face in the direction of the optical axis. An edge face of the peripheral sleeve is spaced away from the magnetic shield member a distance effective to provide magnetic isolation therebetween.

In a preferred embodiment, the magnetic shield member constitutes a sample chamber.

BRIEF DESCRIPTION OF THE DRAWINGS

FIG. 8 is a cross-sectional view of the prior art structure of a SEM.

FIG. 9A is a schematic sectional view of a single-pole magnetic lens.

FIG. 9B is a diagram illustrating a magnetic flux distribution of the single-pole magnetic lens of FIG. 9A.

DESCRIPTION OF THE PREFERRED EMBODIMENTS

A fundamental feature of the present invention will firstly be described with reference to FIG. 5 which shows a disc 16a made of magnetic material disposed a distance L from an end face 10a of a central tube 10 of a single-pole magnetic lens 5. In order to set an optimum value for distance L, measurements have been made of the change in the magnetic flux distribution as a function of the variable distance L. FIG. 6 shows the result of the measurement, in which Bop denotes the maximum measured value of magnetic flux density Bz generated from the central tube end face 10a of magnetic disc 16a is removed and Bp denotes the maximum measured value of magnetic flux density Bz if magnetic disc 16a is disposed the variable distance L from end face 10a.

Figure 5:
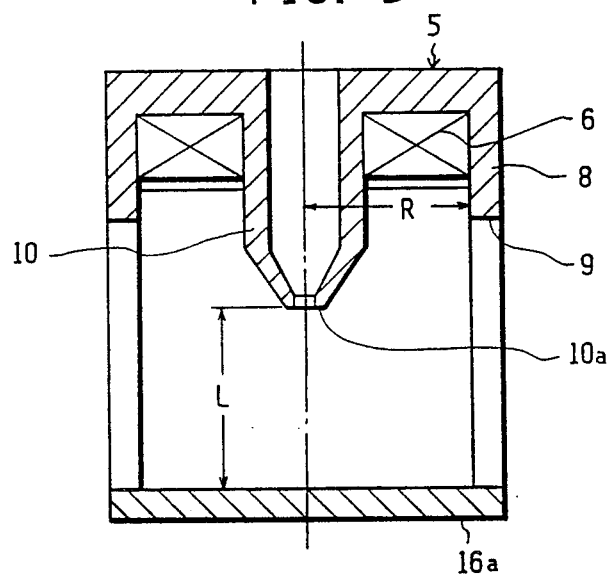
FIG. 5 is a cross-sectional view which illustrates an operational principle of the present invention.
Figure 6:
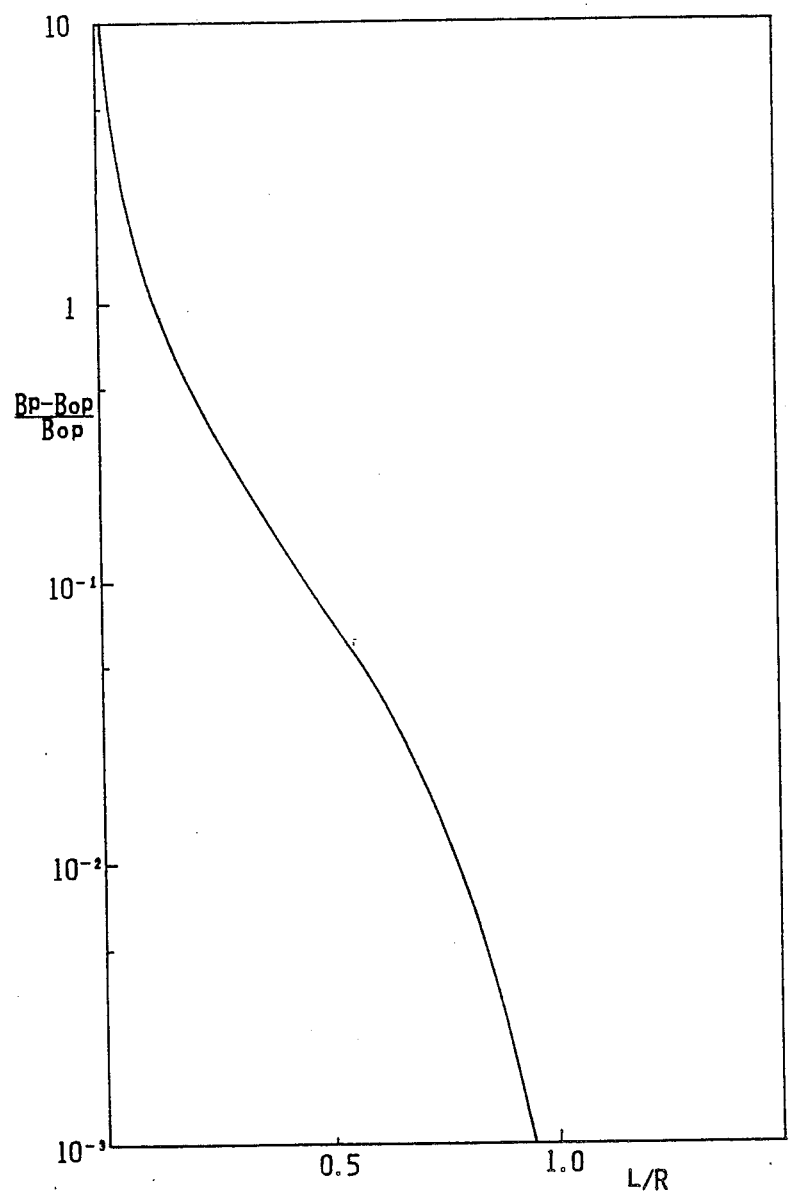
FIG. 6 is a graph showing the relation between L/R and (Bp - Bop)/Bop.

The graph of FIG. 6 indicates the changing rate of Bp relative to Bop, i.e., (Bp - Bop)/Bop in terms of L/R, where R is the inner radius of a peripheral sleeve 8 of lens 5, as shown in FIG. 5. As can be determined from FIG. 6, Bp is greater than twice Bop when L/R <0.1. Bp differs from Bop by less than about 1% when L/R >0.8. Further in case of L≧R, the peak value Bp of the magnetic flux density is equal to the peak value Bop when the magnetic disc is not opposed to the single-pole magnetic lens 5. In addition, the overall distribution of Bz is also the same if the disc is absent or the disc is present provided that L≧R. Namely, if L≧R, the magnetic disc is not magnetically coupled to the single-pole magnetic lens and therefore does not constitute a part of a magnetic circuit of the magnetic lens.

The relation indicated by FIG. 6 is also applicable in a case that central tube end face 10a is positioned in a recessed position relative to the peripheral sleeve edge face 9 as well as in an arrangement where the central tube end face 10a and the peripheral sleeve edge face 9 are disposed on the same plane.

Figure 3:
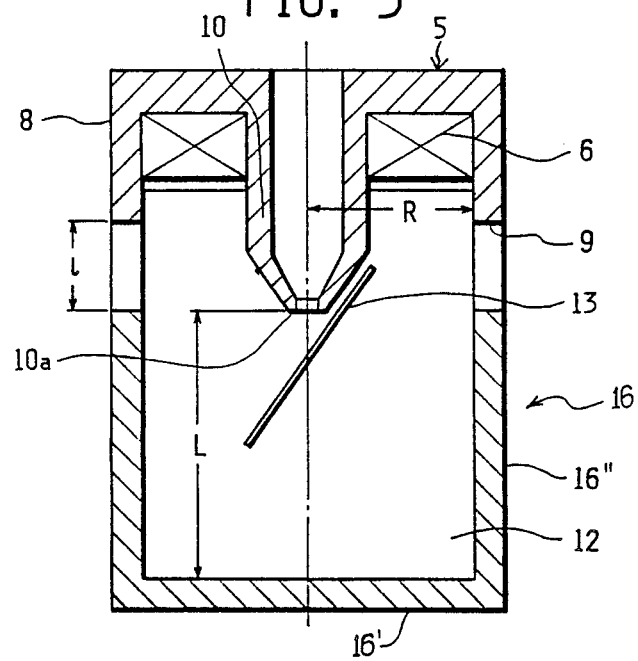
FIG. 3 is a cross-sectional view of an essential part of a third embodiment.
Figure 7:
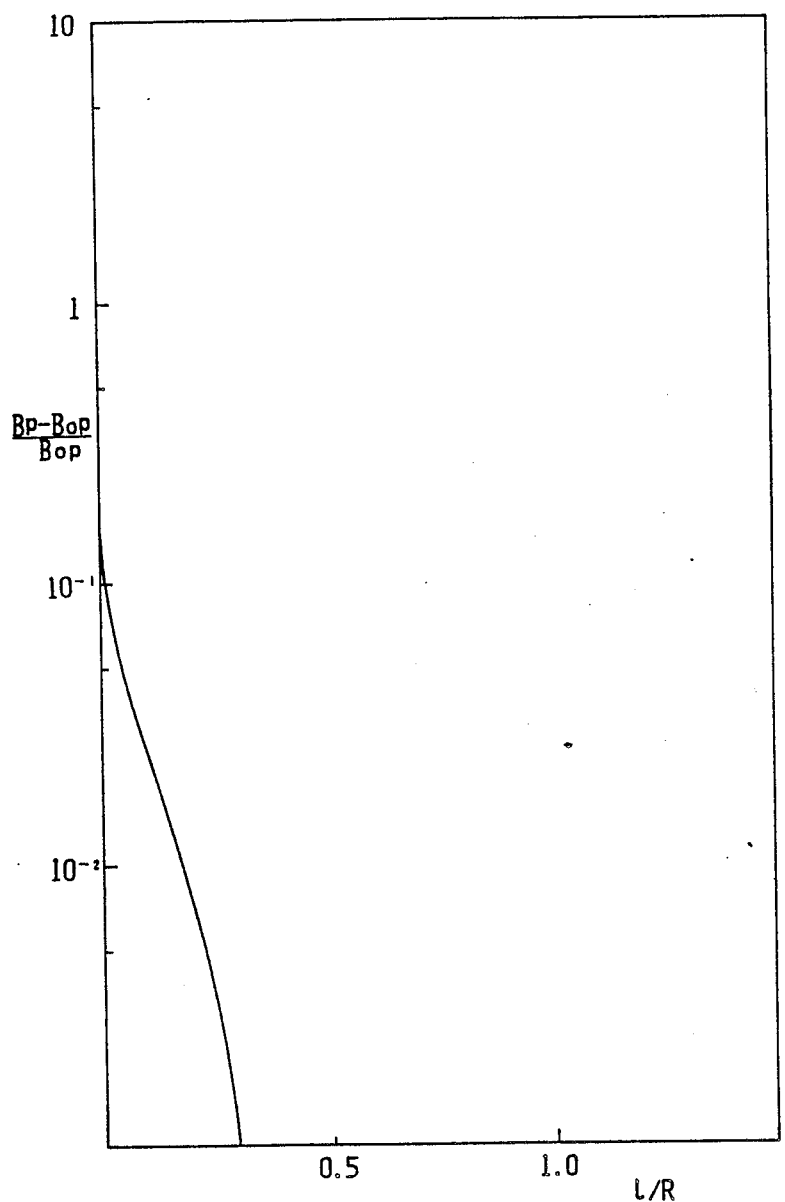
FIG. 7 is a graph showing the relation between l/R and (Bp - Bop)/Bop.

Next, referring to FIG. 3, a magnetic shield member 16 is composed of a magnetic central disc section 16' and a peripheral wall section 16" extending in the axial direction toward the edge face 9 of peripheral sleeve 8. FIG. 7 shows the changing rate of Bp relative to Bop, i.e., (Bp - Bop)/Bop in terms of l/R for changing values of l where l is the height of a gap between the peripheral sleeve edge face 9 of the single pole magnetic lens and the edge face of peripheral wall section 16 of the magnetic shield member 16 and while satisfying L≧R.

When l=0, i.e., when the peripheral sleeve edge face 9 of the single-pole magnetic lens is magnetically connected to the peripheral wall section 16 of the magnetic shielding member, and when the distance L between the central tube end face 10a and the bottom disc face of the cylindrical magnetic shielding member satisfies the relation L≧R, the maximum value Bp of the magnetic flux density Bz is about 20% greater than Bop which is measured in the arrangement where the single-pole magnetic lens 5 is disposed alone. Further as seen from FIG. 7, when the spatial gap l increases, the value of Bp rapidly approaches Bop. Namely, in case l/R ≧0.2, the value of Bp differs from Bop by less than about 1%. Further in case l/R≧⅓, the value of Bp is identical to that of Bop. Accordingly, it is advisable to provide a substantial spatial gap l sufficient to magnetically isolate shield member 16 from single-pole magnetic lens 5.

As described above, by constructing and arranging magnetic shield member 16 and single-pole magnetic lens 5 according to the present invention, magnetic shield member 16 does not constitute a part of the magnetic circuit of the single-pole magnetic lens 5 and functions as a shield against external disturbing magnetic fields. The magnetic shield member need not necessarily have an axially symmetric configuration. It may have a rectangular shape effective to facilitate mounting of detectors, etc.

In the embodiment shown in FIG. 3, the radius of peripheral sleeve 8 of single-pole magnetic lens 5 is identical to that of the peripheral cylindrical wall 16" of magnetic shield member 16. However, their radii need not necessarily be identical, and the relation indicated by FIG. 7 can be maintained even if one of the radii is greater than the other.

Figure 1:
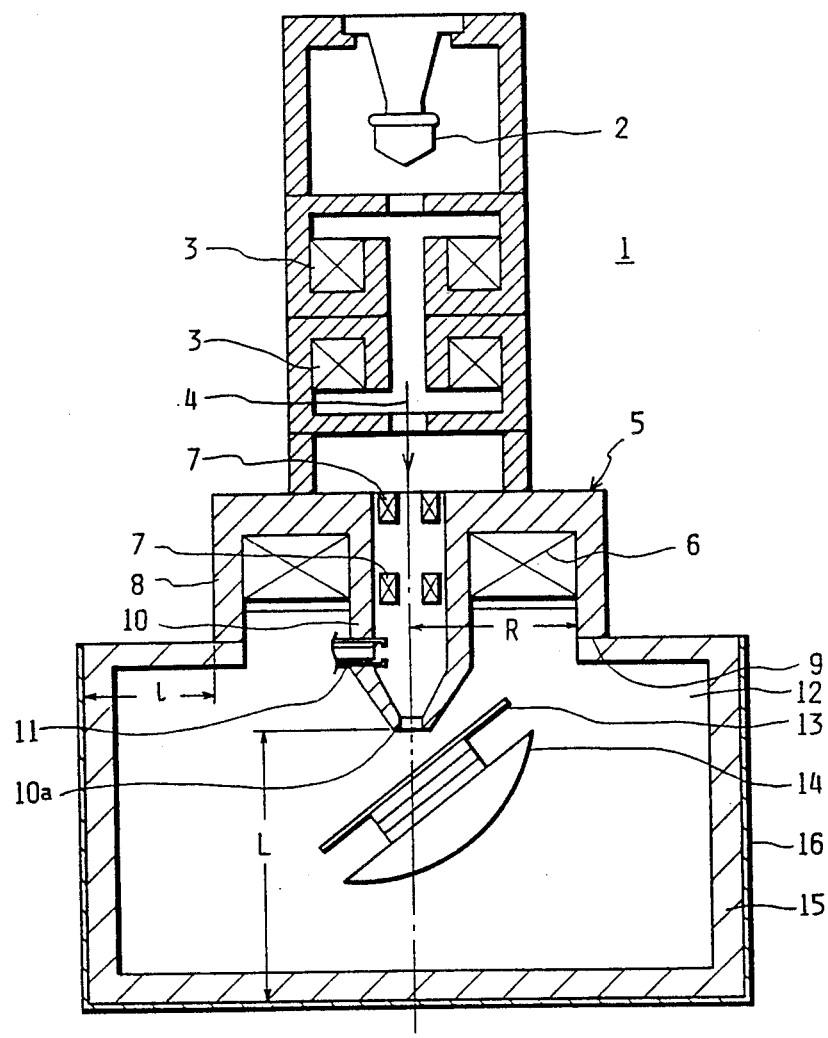
FIG. 1 is a simplified pictorial, elevational cross-sectional view of an overall structure of a first embodiment of the present invention.

FIG. 1 shows an SEM apparatus according to a first embodiment of the present invention. Apparatus 1 is comprised of an electron gun 2 for emitting an electron beam 4 along an optical axis and a condenser lens 3 for concentrating the electron beam 4. Single pole magnetic lens 5 is provided to focus the electron beam 4 onto a surface of a sample 13, and a scanning coil unit 7 is provided to scan the electron beam 4 across the sample surface.

Sample 13 is disposed within the magnetic field generated by single-pole magnetic lens 5. Therefore, the focused electron beam or electron probe has a spot diameter smaller than that of a focused electron beam generated by the conventional SEM objective lens in which a sample is disposed outside of the magnetic field. Upon irradiation with the electron probe, a secondary electron stream is released from sample 13 and is drawn by the magnetic field generated by end face 10a of central tube or pole 10 of magnetic lens 5 into central tube 10. A secondary electron detector 11 is disposed within central tube 10 to detect the secondary electrons.

A sample stage 14 is provided to undergo XY displacement, rotation and tilting while supporting sample 13, which may have a large diameter up to 6 inches.

A sample chamber 12 made of nonmagnetic material is connected to peripheral sleeve 8 of single-pole magnetic lens 5. Sample chamber 12 is magnetically shielded by shield member 16. Sample chamber 12 and magnetic shield member 16 are not necessarily of axially symmetric configuration, but may be of rectangular shape. The cylindrical shield member 16 has bottom or central disc section 16' which is opposed to central tube end face 10a of lens 5 at a distance L therefrom, where L is equal to or greater than the inner radius R of peripheral sleeve 8 of magnetic lens 5. Further, shield member 16 has peripheral wall section 16", a circular edge of which is spaced radially from the edge 9 of peripheral sleeve 8 of magnetic lens 5 by a gap of length l in the direction perpendicular to the optical axis of apparatus 1 so as to magnetically separate the shield member 16 from magnetic lens 5.

Figure 2:
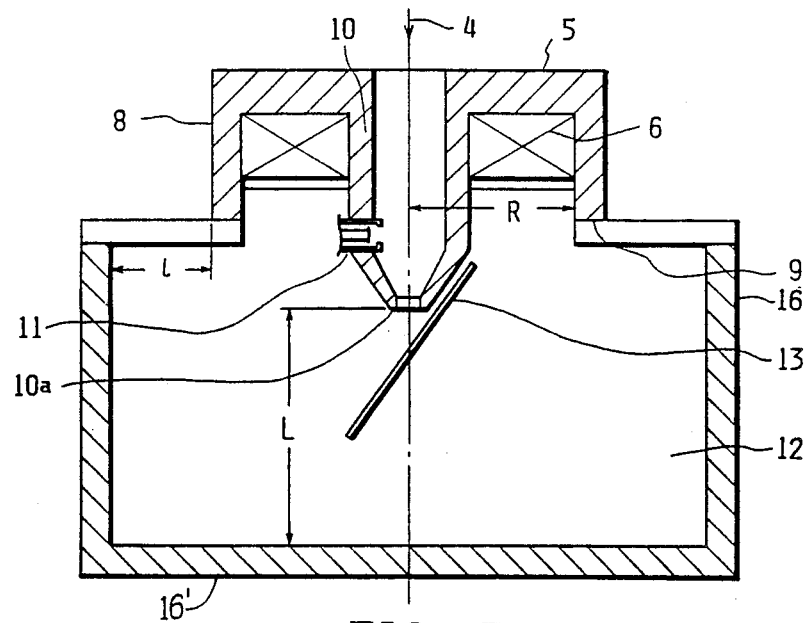
FIG. 2 is a cross-sectional view of an essential part of a second embodiment.

FIG. 2 is a sectional view showing an essential part of a second embodiment of the present invention. Sample chamber 12 is here composed of magnetic material effective to function as magnetic shield member 16. In a manner similar to the FIG. 1 embodiment, the bottom face 16' of cylindrical sample chamber 12 of magnetic material is spaced from end face 10a of central tube 10 of single-pole magnetic lens 5 by a distance L which is equal to greater than the inner radius R of peripheral sleeve 8 of magnetic lens 5. Further, the peripheral edge of sample chamber 12 made of magnetic material is spaced from edge 9 of peripheral sleeve 8 of magnetic lens 5 by a radial gap l sufficient to magnetically isolate lens 5 from sample chamber 12.

As described above with reference to FIGS. 1 and 2, the magnetic shield member and the sample chamber made of magnetic material do not constitute a part of the magnetic circuit of the single-pole magnetic lens 5 and function only to magnetically block external disturbing magnetic fields.

FIG. 3 is a cross-sectional view showing an essential part of a third embodiment of the present invention. Its detailed construction has been already described above.

Figure 4:
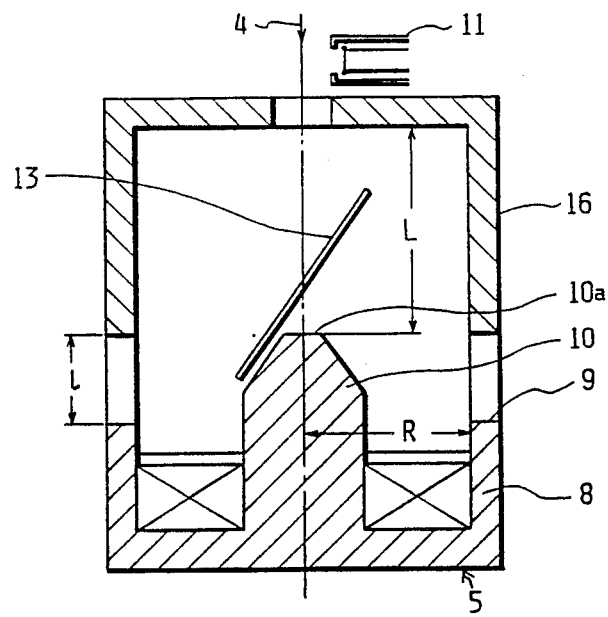
FIG. 4 is a cross-sectional view of an essential part of a fourth embodiment.

In the embodiments of FIGS. 1, 2 and 3, the electron beam from the electron gun and condenser system 40 passes through the central tube of the single-pole magnetic lens, and thereafter irradiates the sample. On the other hand, FIG. 4 shows a fourth embodiment based on a certain reversal of parts. Namely, a single-pole magnetic lens 5 is disposed upside down below sample 13. An incident electron beam 4 is focused onto a surface of sample 13 by a magnetic field generated from end face 10a of central pole piece 10 which is disposed below sample 13, and induced secondary electrons are detected by detector 11 disposed above, or ahead of, magnetic shield member 16. Similar to the FIG. 1 embodiment, a bottom section of magnetic shield member 16 is spaced from the central pole end face 10a by a distance L equal to or greater than the inner radius R of peripheral sleeve 8 of magnetic lens 5, and the peripheral edge of magnetic shield member 16 is spaced axially from peripheral sleeve edge 9 of the magnetic lens 5 by a magnetic gap l sufficient to magnetically separate shield member 16 from magnetic lens 5.

As described above, according to the invention, a single-pole magnetic lens is utilized as an objective lens so as to provide a large sample space, and the sample is magnetically shielded by the magnetic shield member, which is specifically dimensioned and shaped to avoid disturbance of the magnetic field distribution of the single-pole magnetic lens while effectively blocking external disturbing magnetic fields which would be applied to the sample. The invention thus prevents axis dislocations and astigmatism and enables high resolution observation of the sample. Further, in view of the available large sample space, a movable sample state can be provided to undergo XY displacement, rotation and tilting.

This application relates to subject matter disclosed in Japanese Patent Application No. 63-279987, filed on November 5, 1988, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. Apparatus for directing a scanned electron beam to a sample along an axis, comprising: a single-pole objective magnetic lens for focusing the scanned electron beam onto the sample, said objective magnetic lens including a central pole portion extending along the axis and having an axial end face, said lens being operative to generate a magnetic field for focusing the scanned electron beam onto the sample, said lens further including a peripheral sleeve portion extending along the axis and having a peripheral edge face effective to form a magnetic circuit between said end face and said peripheral edge face, said peripheral sleeve portion having an inner radius R; and a magnetic shield member disposed to surround, and magnetically shield the sample, said magnetic shield member having a central section spaced axially from said end face of said pole portion by a distance L which is not substantially less than R so that said magnetic shield member is not magnetically coupled to said magnetic circuit, and said shield member having a peripheral section spaced from said peripheral edge face of said peripheral sleeve by a distance sufficient to magnetically isolate said magnetic shield member from said magnetic lens.

2. An apparatus according to claim 1 wherein said magnetic shield member comprises a sample chamber for containing the sample.

3. An apparatus according to claim 1 wherein the spacing between said peripheral section of said shield member and said peripheral edge face of said sleeve is not less than 0.2R.

4. An apparatus according to claim 1 wherein L is not less than R.

* * * * *